United States Patent
Zhang et al.

(10) Patent No.: US 8,075,157 B2
(45) Date of Patent: Dec. 13, 2011

(54) LED MODULE

(75) Inventors: Hai-Wei Zhang, Shenzhen (CN); Jia-Chuan Lv, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 209 days.

(21) Appl. No.: 12/604,409

(22) Filed: Oct. 23, 2009

(65) Prior Publication Data

US 2011/0007513 A1  Jan. 13, 2011

(30) Foreign Application Priority Data

Jul. 10, 2009 (CN) .......................... 2009 1 0304204

(51) Int. Cl.
*F21V 21/00* (2006.01)

(52) U.S. Cl. .................................. 362/249.02; 362/307

(58) Field of Classification Search ............. 362/217.01, 362/217.02, 222, 223, 97.3, 608
See application file for complete search history.

(56) References Cited

U.S. PATENT DOCUMENTS

| | | |
|---|---|---|
| 2006/0018010 A1* | 1/2006 | Blumel .................... 359/351 |
| 2006/0164833 A1* | 7/2006 | Parkyn et al. ............. 362/235 |
| 2006/0198144 A1* | 9/2006 | Miyairi et al. ............ 362/257 |
| 2008/0088770 A1* | 4/2008 | Hwang et al. ............. 349/64 |

* cited by examiner

*Primary Examiner* — Julie Shallenberger
(74) *Attorney, Agent, or Firm* — Altis Law Group, Inc.

(57) ABSTRACT

An LED module includes an LED having an optic axis and a lens fixed over the LED for refracting light emitted by the LED. The lens has a same cross section along a front-to-rear direction thereof. The lens has an inner incidence surface facing the LED and an outer emission surface. The inner incidence surface is concave toward the emission surface. The emission surface has a middle part around the optic axis of the LED concave toward the incidence surface, and two convex lateral parts off the optic axis of the LED. A peak intensity for the light generated by the LED and penetrating through the lens occurs within the convex lateral parts of the emission surface.

6 Claims, 7 Drawing Sheets

LED MODULE

BACKGROUND

1. Technical Field

The present disclosure relates generally to a light emitting diode (LED) module, and more particularly to an LED module for lighting.

2. Description of Related Art

LED lamp, a solid-state lighting, utilizes LEDs as a source of illumination, providing advantages such as resistance to shock and nearly limitless lifetime under specific conditions.

LED lamps have been applied for street lighting recently. Generally, the light from the LEDs has been adjusted by a reflector to illuminate along a predetermined direction. However, such adjustment cannot increase an illuminate area. Further, such adjustment remains a peak intensity of the light occurring around a center axis of each of the LED, which easily results in a discomfort glare, increasing a hidden danger for the traffic safety.

What is needed therefore is an LED module adopted in an LED lamp having a design which can overcome the above limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
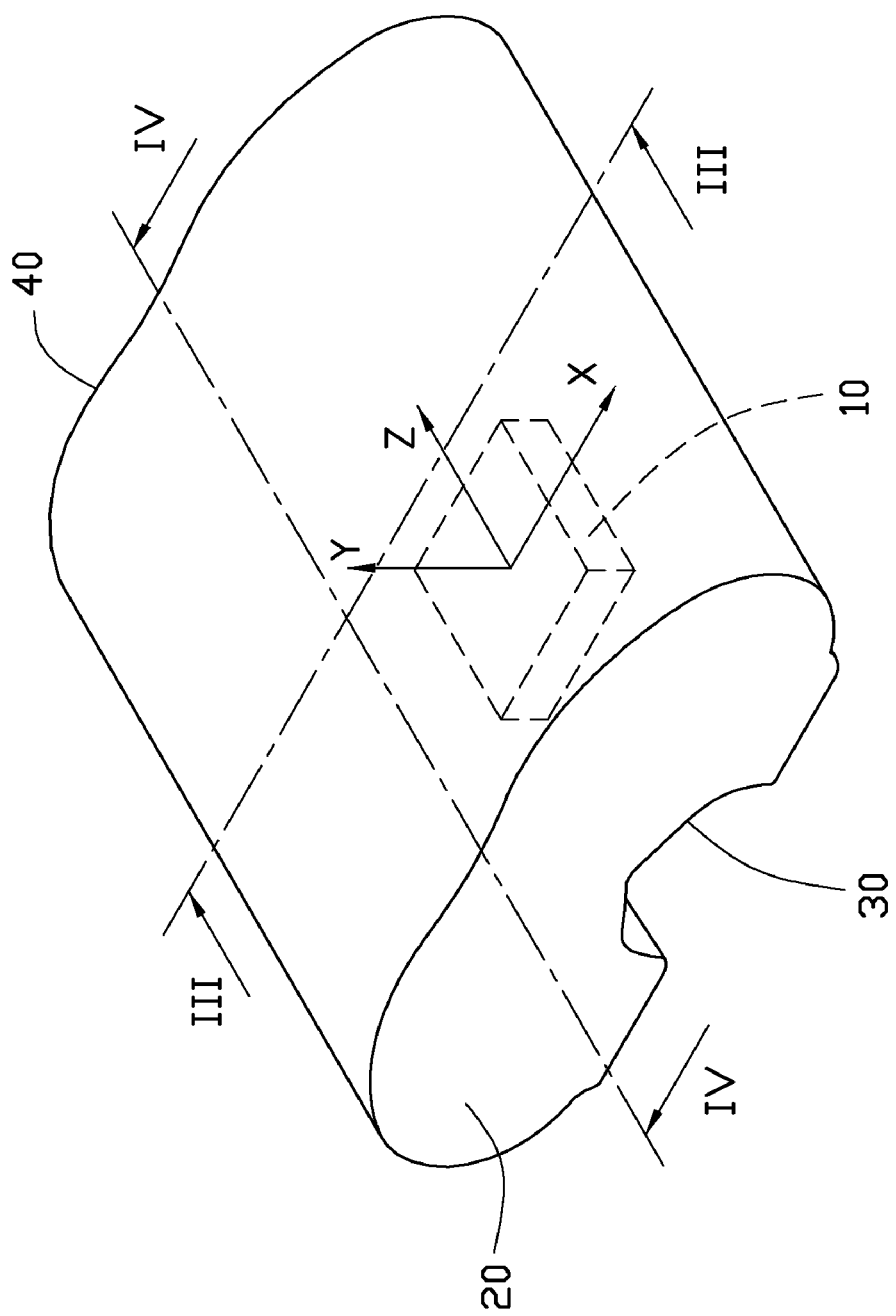
FIG. 1 is an isometric, assembled view of an LED module in accordance with a first embodiment of the present disclosure.
Figure 2:
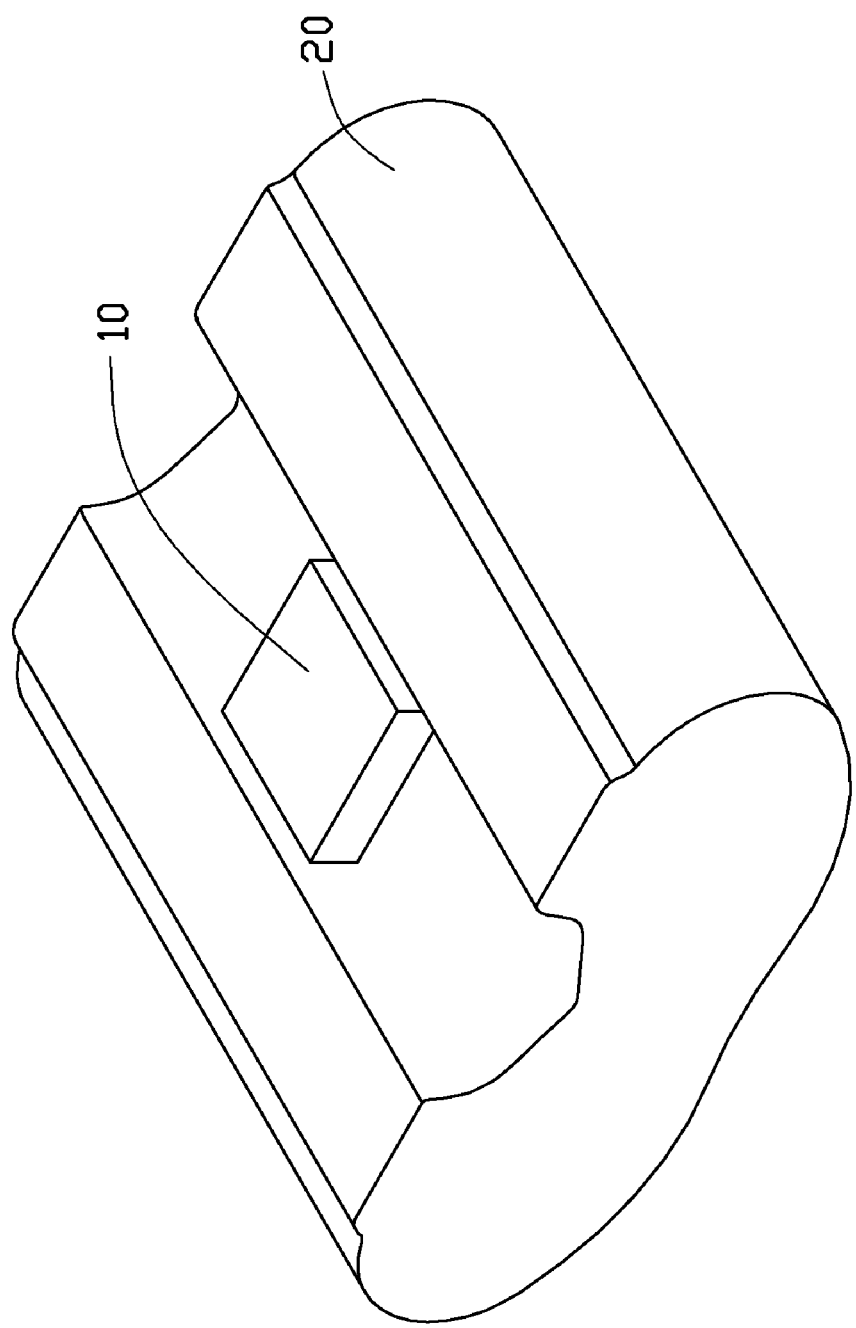
FIG. 2 is an inverted view of the LED module of FIG. 1.

FIGS. 1-2 illustrate an LED module in accordance with a first embodiment of the present disclosure. The LED module is utilized in a lighting fixture and comprises an LED 10 and a lens 20 covering the LED 10. The LED 10 has a rectangular shape. Light generated by the LED 10 emits from a top face thereof.

Figure 3:
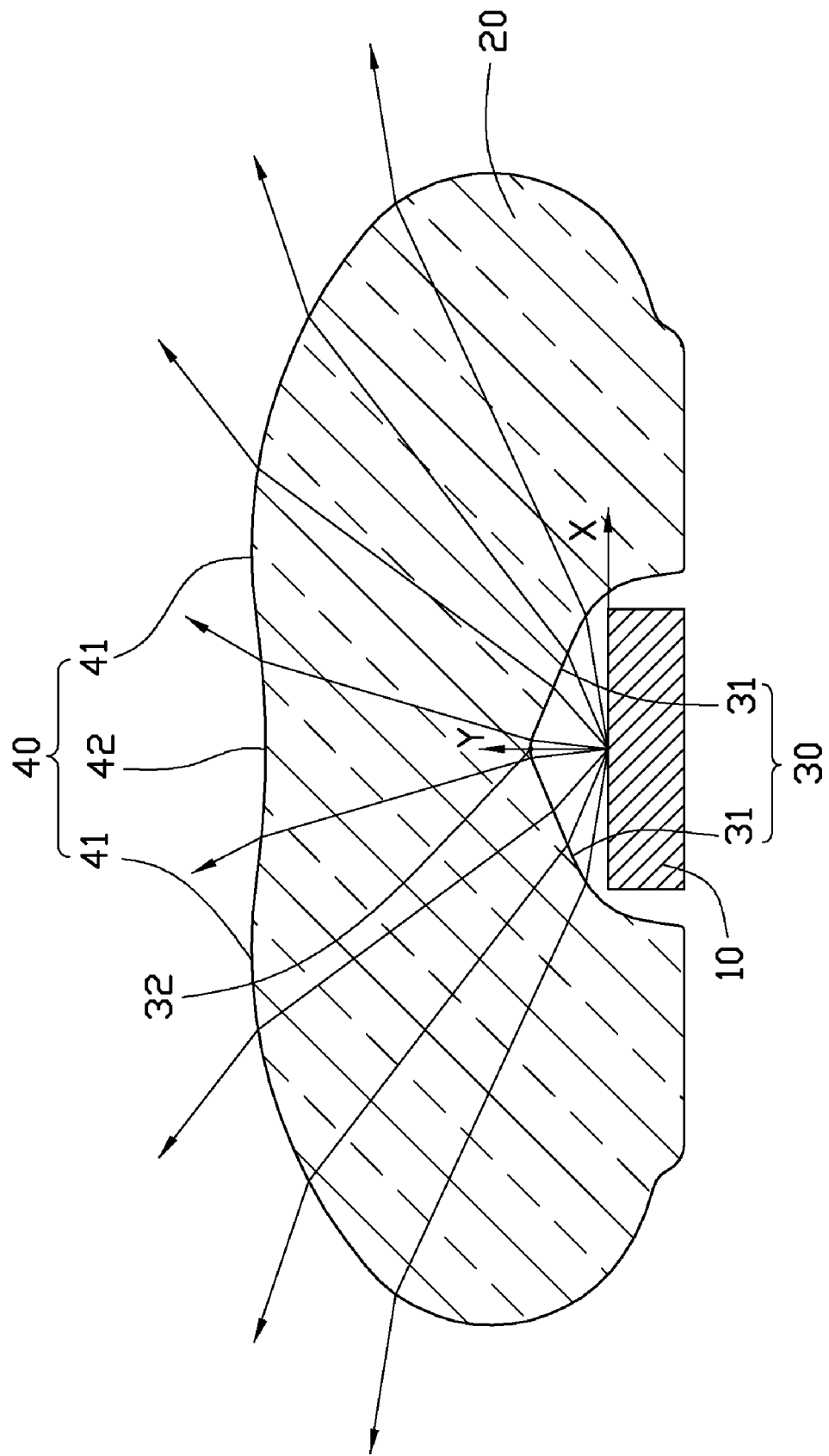
FIG. 3 is a cross-sectional view of the LED module of FIG. 1, taken along line III-III thereof.
Figure 4:
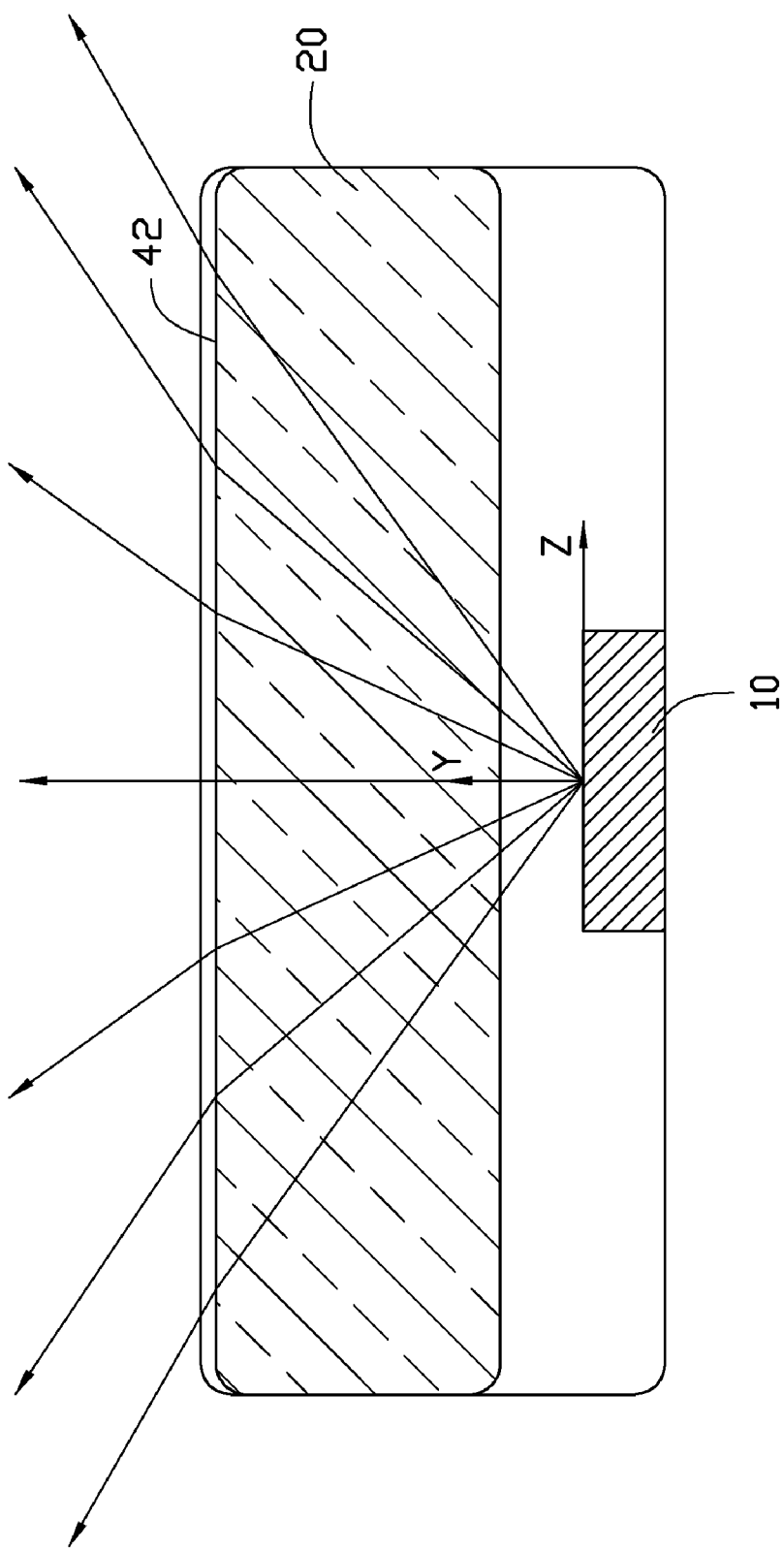
FIG. 4 is a cross-sectional view of the LED module of FIG. 1, taken along line IV-IV thereof.

Also referring to FIGS. 3-4, the lens 20 is integrally made of a transparent material with good optical performance, such as PMMA or PC. In order to facilitate the description of the lens 20, a rectangular coordinate system (X,Y,Z) is used in which an axis X extends from left to right, an axis Y extends from bottom to top, an axis Z extends from front to rear. The axis Y is also an optic axis of the LED 10.

The lens 20 is lengthwise and has the same cross-section along the axis Z. The lens 20 also has an optical axis which is coincident with the axis Y of the LED 10. The lens 20 is symmetric relative to the axis Y and symmetric relative to the axis Z. The lens 20 is formed by cutting an elongated semi-finished product into a plurality of finished products each having a predetermined length, in which the semifinished product is made by injection or extrusion molding of PMMA or PC. Therefore, the lens 20 is manufactured easily and has a low manufacturing cost. In the first embodiment, the lens 20 has a length along the axis Z equal to a width along the axis X thereof. A height of the lens 20 is smaller than the length and width thereof, whereby the lens 20 has a configuration of a flat block with two opposite lateral sides being arc in shape. A bottom side of the lens 20 consists of two opposite planar sections and a middle, recessed section interconnecting the two opposite planar section. A top side of the lens 20 consists of three continuous curved sections. The middle, recessed section of the bottom side of the lens 20 forms an inner incidence surface 30 facing the LED 10. The top side of the lens 20 forms an outer emission surface 40 opposite to the inner incidence surface 30. The light from the LED 10 enters the lens 20 via the incidence surface 30, runs through the lens 20, and leaves the lens 20 through the outer emission surface 40. The incidence surface 30 and the emission surface 40 are both smoothly curved surfaces.

The incidence surface 30 is concave upwardly to the emission surface 40 and defines an inverted V-shaped groove recessed upwardly from the bottom side of the lens 20. The incidence surface 30 includes two lateral planar, inclined parts 31 symmetric relative to the axis Y. The two inclined parts 31 confront each other at a peak 32 of the incidence surface 30. The peak 32 is on the axis Y. An included angle of 130-140 degrees is defined between the two inclined parts 31 of the incidence surface 30.

The emission surface 40 is located at a top of the lens 20. The emission surface 40 includes a middle part 42 and two lateral parts 41. The middle part 42 is concave downwardly and toward the incidence surface 30. The lateral parts 41 are convex upwardly. The concave middle part 42 and the convex lateral parts 41 of the emission surface 40 are provided for refracting the light to achieve a desired light-directing optical pattern and characteristic. FIG. 3 shows light beams through the emission surface 40, which are refracted by the middle part 42 away from the axis Y, thereby reducing a light intensity around the axis Y.

Figure 5:
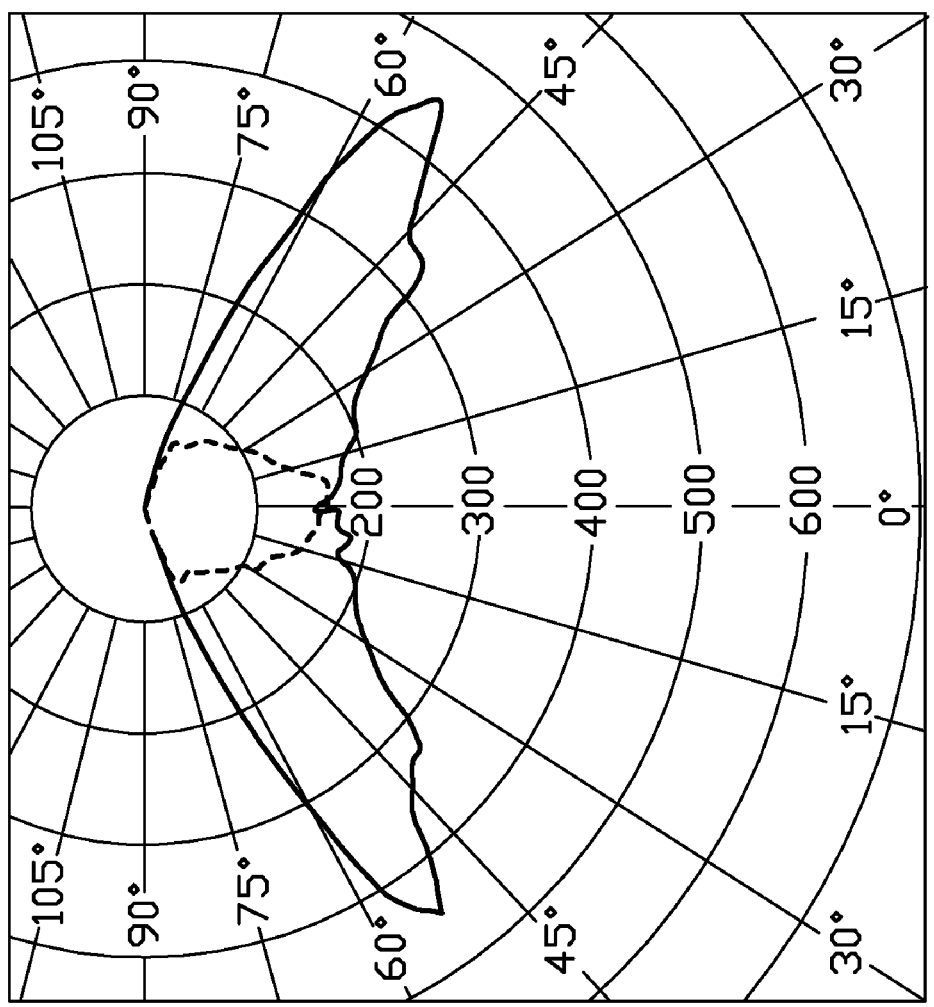
FIG. 5 is a graph illustrating light intensity vs. angle for the LED module of FIG. 1.

FIG. 5 shows a graph illustrating light intensity vs. angle for the LED module of FIG. 1, in which a real line indicating the light intensity vs. angle for the LED module at the X-Y plane of FIG. 3, and a broken line indicating the light intensity vs. angle for the LED module at the Z-Y plane of FIG. 4. Referring to the real line, after the light being refracted by the lens 20, the peak light emission for the LED 10 occurs within 45-60 degrees off the axis Y. The light emission along the axis Y is 40%-48% of the peak emission. Half-peak light emission for the LED 10 occurs within 20-30 degrees and 60-70 degrees off the axis Y. Referring to FIG. 3 also, the light intensity gradually increases from the part 42 to the parts 41 and has the peak emission at middles of the parts 41, and then decreases sharply. The light brightness turns to be zero when the light offsets the axis Y close to 75 degree. Referring to the broken line, the peak light emission for the LED 10 occurs at the axis Y, and gradually decreases off the axis Y.

As described above, since the half-peak intensity of the light occurs at a large degree offsetting the axis Y, i.e., 60-70 degrees, the LED module can illuminate a larger area compared with the conventional one and avoid the glare generated by the conventional LED module, which is caused by a too large concentration of light intensity at a determined location, i.e., center of the conventional LED module. Furthermore, since the middle part 42 of the emission surface 40 is concave to the incidence surface 30 along the axis Y, the peak light emission for the LED 10 occurs within 45-60 degrees off the axis Y. More light can be adjusted to illumination areas off the axis Y; thus, the light can be uniformly distributed over the illumination areas.

Figure 6:
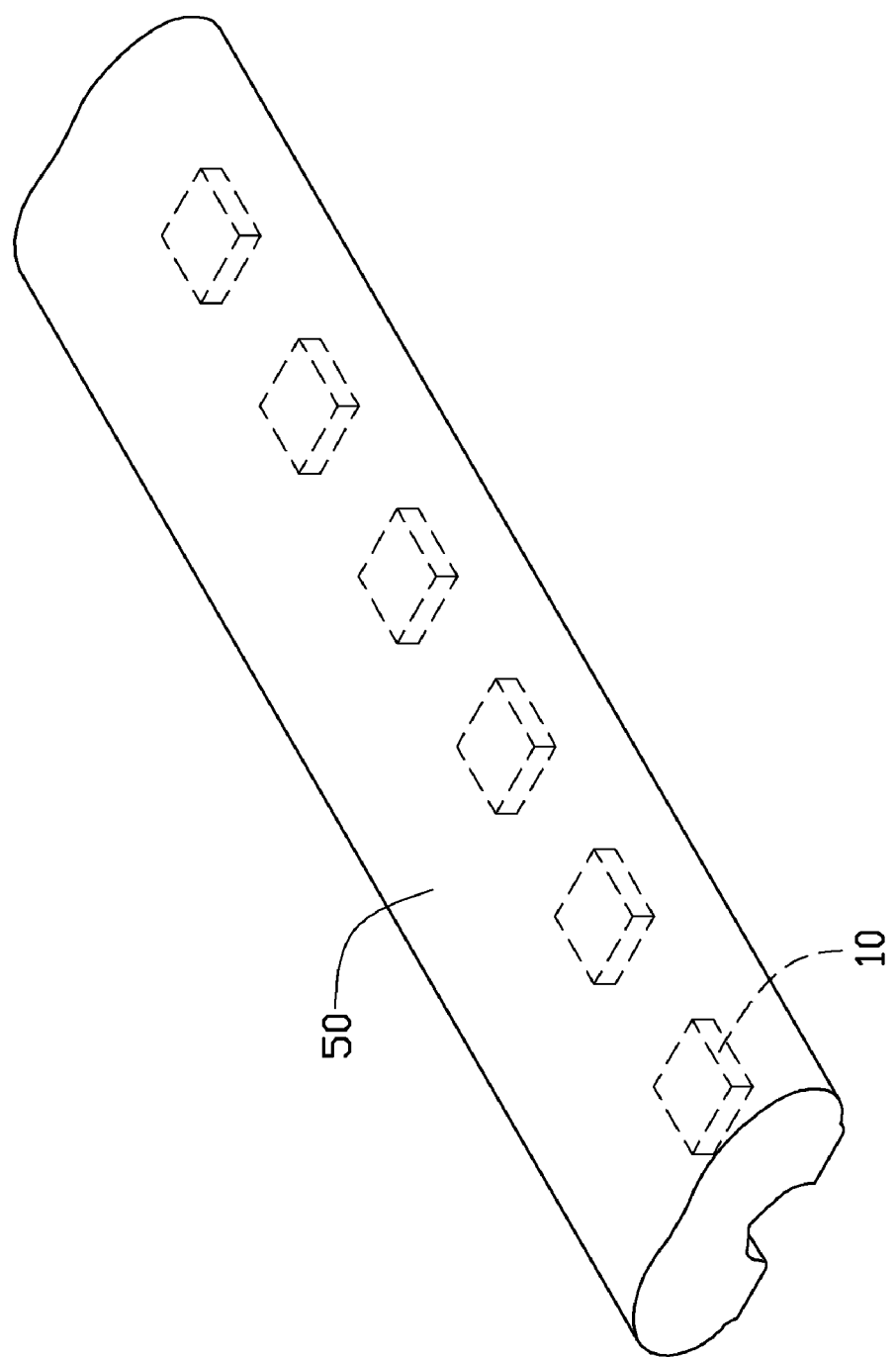
FIG. 6 is an isometric, assembled view of an LED module in accordance with a second embodiment of the present disclosure.

FIG. 6 shows an LED module in accordance with a second embodiment of the present disclosure. In this embodiment, the lens 50 has a same cross-section as that of the lens 20 of the first embodiment, and a length larger than that of the lens 20 of the first embodiment. The lens 50 is used to cover a plurality of LEDs 10 which are arranged in a line to increase the luminous intensity and illuminated area of the light generated by the LED module. The length of the lens 50 correlates to an amount of the LEDs 10. In this embodiment, since the amount of the LEDs 10 is six, the length of the lens 50 is six times of the width of the lens 50.

Figure 7:
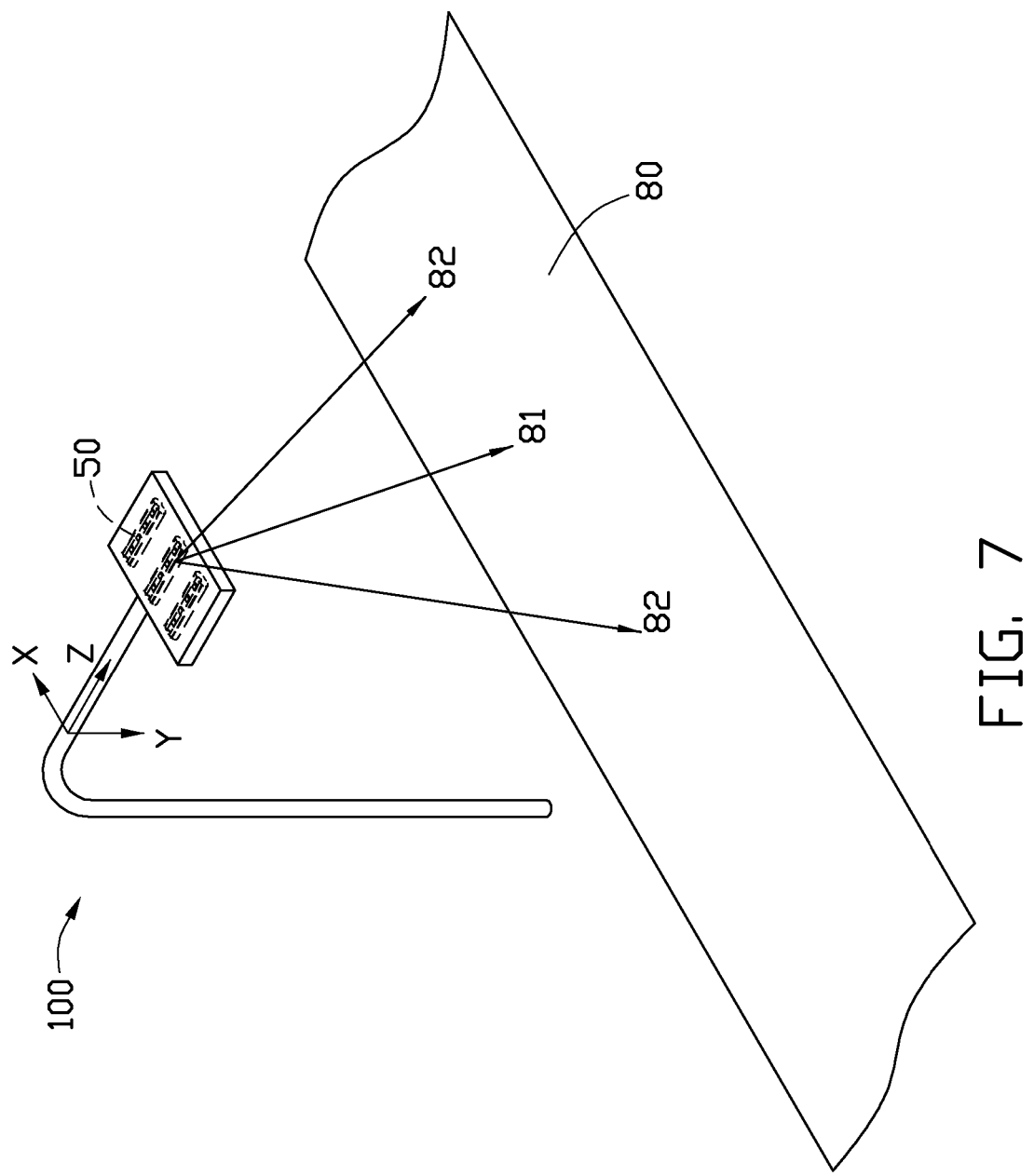
FIG. 7 shows a street lamp applying the LED modules of FIG. 6.

Also referring to FIG. 7, when a street lamp 100 applying a plurality of LED modules of the second embodiment is mounted at a side of a road 80, light generated by the LEDs 10 is refracted by the lenses 50 to reduce a light intensity at an illumination area 81 of the road 80 around the axis Y and increase a light intensity at illumination areas 82 off the axis Y. Since the illumination areas 82 are far off the street lamp 100, an illumination of the illumination areas 82 are approximately equal to that of the illumination areas 81 in intensity. The light can be uniformly distributed over the illumination areas 81, 82 of the road 80, whereby utilization efficiency of the LED light source is thus enhanced effectively.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED module comprising:
    an LED having an optic axis extending through a center thereof along a top to bottom direction; and
    a lens fixed over the LED for refracting light emitted by the LED, the lens having a configuration of a block with a curved top side, two opposite curved lateral sides and a bottom side, a cross section of the lens along a front to rear direction being the same, the lens having an inner incidence surface recessed from the bottom side and facing the LED and an outer emission surface at the top side, the inner incidence surface defining a groove receiving the LED therein, the inner incidence surface being concave toward the emission surface, the emission surface having a middle part around the optic axis of the LED concave toward the incidence surface, and two convex lateral parts off the optic axis of the LED;
    wherein a peak intensity for light generated by the LED and penetrating through the lens occurs at the convex lateral parts of the emission surface;
    wherein the groove defined by the incidence surface has an inverted V-shaped configuration; and
    wherein the incidence surface has two lateral planar, inclined parts, and an included angle between the inclined parts is 130-140 degrees.

2. The LED module as claimed in claim 1, wherein the lens is symmetric relative to the optic axis of the LED along the front to rear direction and along the lateral direction of the lens.

3. The LED module as claimed in claim 1, wherein the incidence surface and the emission surface are both smoothly curved surfaces.

4. The LED module as claimed in claim 1, wherein the lens is obtained by cutting through a semifinished product which is formed by one of injection molding and extrusion molding.

5. The LED module as claimed in claim 1, wherein the peak intensity occurs within 45-60 degrees off the optic axis of the LED.

6. The LED module as claimed in claim 1, wherein a half-peak intensity occurs within 20-30 degrees and 60-70 degrees off the optic axis of the LED.

* * * * *